United States Patent
Chen et al.

(10) Patent No.: US 7,692,274 B2
(45) Date of Patent: Apr. 6, 2010

(54) REINFORCED SEMICONDUCTOR STRUCTURES

(75) Inventors: Hsien-Wei Chen, Tainan (TW); Shih-Hsun Hsu, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/649,244

(22) Filed: Jan. 4, 2007

(65) Prior Publication Data

US 2008/0164468 A1   Jul. 10, 2008

(51) Int. Cl.
*H01L 23/544* (2006.01)
(52) U.S. Cl. ............... 257/620; 257/618; 257/E23.002; 257/E23.193; 438/460; 438/666
(58) Field of Classification Search ................. 257/690, 257/620, 750, 758, 692, E23.002, E23.194; 438/462, 465, 666
See application file for complete search history.

(56) References Cited

U.S. PATENT DOCUMENTS

| | | | |
|---|---|---|---|
| 6,452,274 B1 | 9/2002 | Hasegawa et al. | |
| 6,468,894 B1 | 10/2002 | Yang et al. | |
| 6,495,918 B1 * | 12/2002 | Brintzinger | 257/758 |
| 6,570,243 B1 | 5/2003 | Hagihara et al. | |
| 6,707,064 B2 | 3/2004 | Jang et al. | |
| 6,709,954 B1 * | 3/2004 | Werking | 438/460 |
| 6,713,843 B2 | 3/2004 | Fu et al. | |
| 7,335,577 B2 * | 2/2008 | Daubenspeck et al. | 438/462 |
| 2005/0230005 A1 * | 10/2005 | Liang et al. | 148/33.3 |
| 2006/0001144 A1 * | 1/2006 | Uehling et al. | 257/690 |
| 2006/0012012 A1 * | 1/2006 | Wang et al. | 257/620 |
| 2007/0023932 A1 * | 2/2007 | Sogawa et al. | 257/797 |

* cited by examiner

*Primary Examiner*—Fernando L Toledo
*Assistant Examiner*—Mamadou Diallo
(74) *Attorney, Agent, or Firm*—Birch, Stewart, Kolasch & Birch, LLP

(57) ABSTRACT

Reinforced semiconductor structures are provided. An exemplary embodiment of a reinforced semiconductor structure comprises a semiconductor wafer comprising a plurality of dielectric layers formed thereon. At least one scribe line region is defined over the semiconductor wafer, separating the semiconductor wafer with at least two active regions thereover. A plurality of first non-dielectric pillars are formed in the topmost layer of the dielectric layers in the scribe line region and surround the test pad along a periphery. A plurality of second non-dielectric pillars and first vias are formed in a first low-k dielectric layer underlying the topmost low-k layer in the scribe line region, wherein the second non-dielectric pillars electrically connect the first non-dielectric pillars by the first vias, respectively.

20 Claims, 14 Drawing Sheets

REINFORCED SEMICONDUCTOR STRUCTURES

BACKGROUND OF THE INVENTION

1. Field of the Invention

The present invention relates to semiconductor device fabrication, and more particularly to a structurally reinforced semiconductor structure for a semiconductor device.

2. Description of the Related Art

Typically, a plurality of semiconductor components are manufactured from a single semiconductor wafer. The semiconductor wafer is portioned into a plurality of die or chips, wherein adjacent chips are separated by scribe lines. The manufacturing process is designed so all the chips on a single semiconductor wafer are identical. Once the transistor circuitry and associated metal interconnects have been fabricated in the active area, the semiconductor wafers are sawed along the scribe lines to separate or singulate the semiconductor wafer into a plurality of semiconductor chips. The chips are then packaged, tested and shipped to customers.

To assess the electrical properties of elements constituting a chip, however, a predetermined pattern of measuring elements or test elements (referred to as a test element group (TEG)) is formed on a scribe line area of a semiconductor wafer. The TEG is electrically tested for determining whether elements are suitably formed in the chips formed on the wafer.

Since the TEG is formed using the same process as a process for forming elements in integrated circuit chips, testing the electrical properties of the TEG can be similar or even identical to test the electrical properties of the elements formed in the chips. Accordingly, the properties of the chips can be correctly deduced by testing the TEG. Once the properties have been tested, there is no reason to retain the TEG. Thus the TEG can be formed in a sacrificial area of the wafer. Hence, the TEG is disposed in a scribe line area of the wafer to prevent a decrease in the number of integrated circuit chips could be produced from the wafer.

FIG. 1 illustrates a top view of a part of a semiconductor wafer 5 comprising a scribe line area 40 separating two active areas 10 and 20 where the transistor circuitry and associated metal interconnects input pads, output pads, and MOS elements (not shown) are formed. In the scribe line area 40, test element groups (TEGs) 30 are disposed in the scribe line area 40 substantially in a linear manner. The TEGs 30 may include TEG modules each having a plurality of MOS elements and associated metal interconnects. FIG. 2 illustrates a cross-section taken along line 2-2 of FIG. 1, but only the associated metal interconnects formed in the TEGs 30 are shown here, for simplicity. As shown in FIG. 2, a top portion of the TEGs 30 is illustrated, including a plurality of dielectric layers 42, 44 and 46, each having metal components 32, functioning as conductive pads or conductive lines, and metal components 34, functioning as vias for connecting components 32 and/or MOS elements (not shown) thereunder. However, with the trend of size reduction of integrated circuits, copper metal incorporating low-k dielectrics having a dielectric constant (k) less than that of the conventional silicon oxide ($SiO_2$) dielectric material (about 4.0) has been adopted in such conductive interconnects of integrated circuits to reduce or prevent increases of RC product (resistance×capacitance) of the interconnects formed in the integrated circuits. Unfortunately, the low-k dielectric materials have disadvantage characteristics such as low mechanical strength, poor dimensional stability, poor temperature stability, high moisture absorption and so on. Therefore, once low-k dielectric materials are used in the metal interconnects of the TEGs 30, microcracking occurs during die sawing or separating along a scribe line 50 (i.e. the dotted line 2-2) and migrates to the active regions of the chips, thereby may seriously damage the circuitry fabricated in each of the chips.

BRIEF SUMMARY OF THE INVENTION

Therefore, a reinforced structure providing additional resistance to lateral stresses is preferably formed in the scribe line area between the active region of the chips adjacent thereto to reduce or even prevent progression of microcracking induced by sawing of the semiconductor wafer.

Reinforced semiconductor structures are provided. An exemplary embodiment of a reinforced semiconductor structure comprises a semiconductor wafer comprising a plurality of low-k dielectric layers formed thereon. At least one scribe line region is defined over the semiconductor wafer, separating the semiconductor wafer with at least two active regions thereover. A plurality of first non-dielectric pillars are formed in the topmost low-k layer of the low-k dielectric layers in the scribe line region and surround the test pad along a periphery. A plurality of second non-dielectric pillars and first vias are formed in a first low-k dielectric layer underlying the topmost low-k layer in the scribe line region, wherein the second non-dielectric pillars electrically connect the first non-dielectric pillars by the first vias, respectively Another embodiment of a reinforced semiconductor structure comprises a semiconductor wafer comprising a plurality of low-k dielectric layers formed thereon. At least one scribe line region is defined over the semiconductor wafer, separating the semiconductor wafer with at least two active regions thereover. At least one test element is formed in the scribe line region, passing through the dielectric layers therein and having a test pad exposed by a topmost low-k layer of the low-k dielectric layers therein, wherein the test pad comprises a recess on opposing sides thereof. A plurality of first non-dielectric pillars are formed in the topmost low-k layer of the dielectric low-k layers in the scribe line region and surround the test pad along a periphery. A second non-dielectric pillar is formed in the topmost low-k layer of the low-k dielectric layers at the recess and is electrically isolated from the test pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Reinforced semiconductor structures will now be described in greater detail. In some embodiments of the invention, such as the exemplary embodiments described, additional resistances against stress induced by die sawing in a scribe line area can be potentially provided. In some embodiments, this can be accomplished by forming a plurality of non-dielectric pillars in at least one dielectric layer of a scribe line area. The non-dielectric pillars may surround a test element formed in the scribe line area along a periphery.

Figure 1:
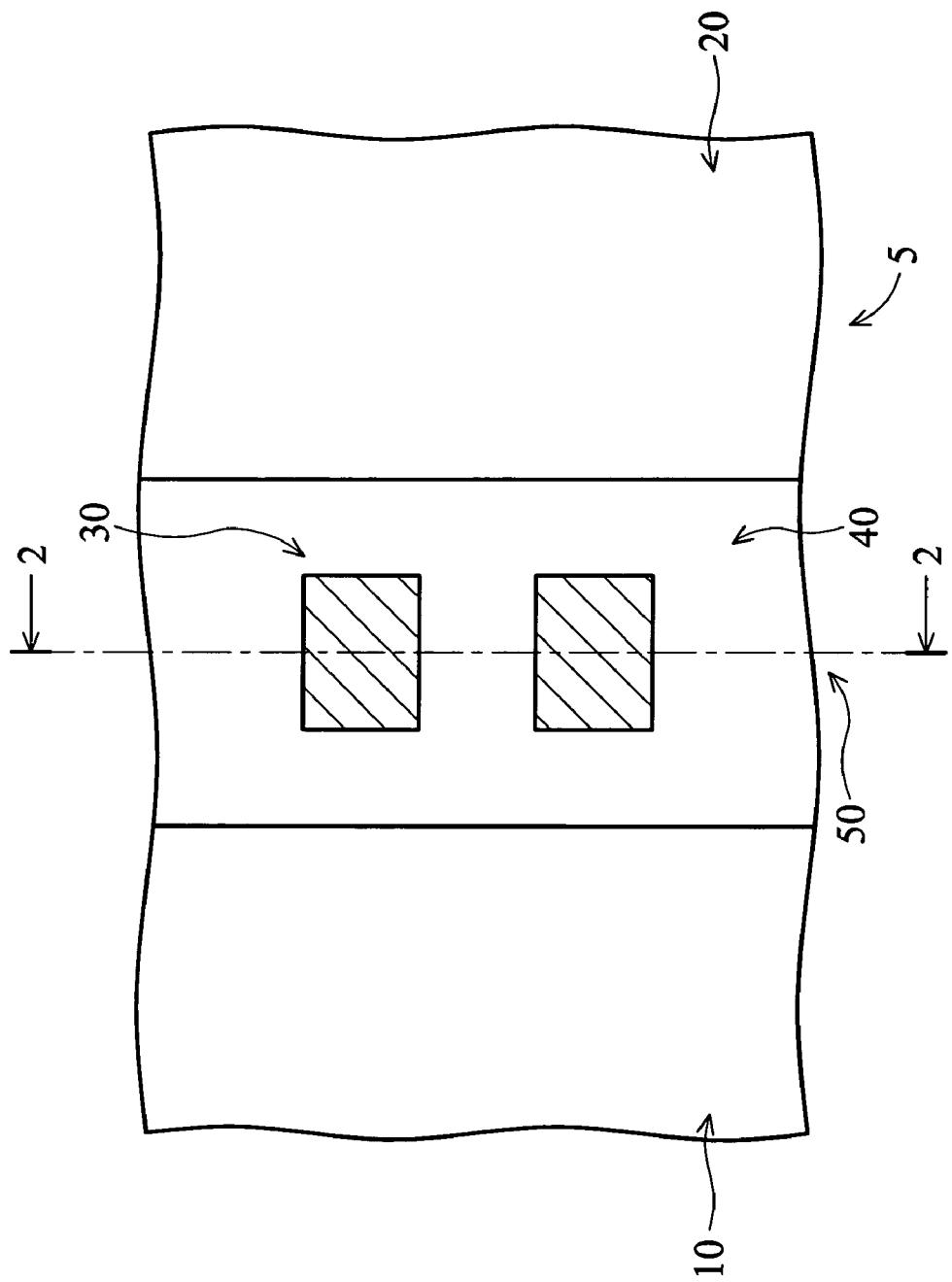
FIG. 1 is top view of a part of a wafer having a scribe line area separating two active areas in the related art.
Figure 2:
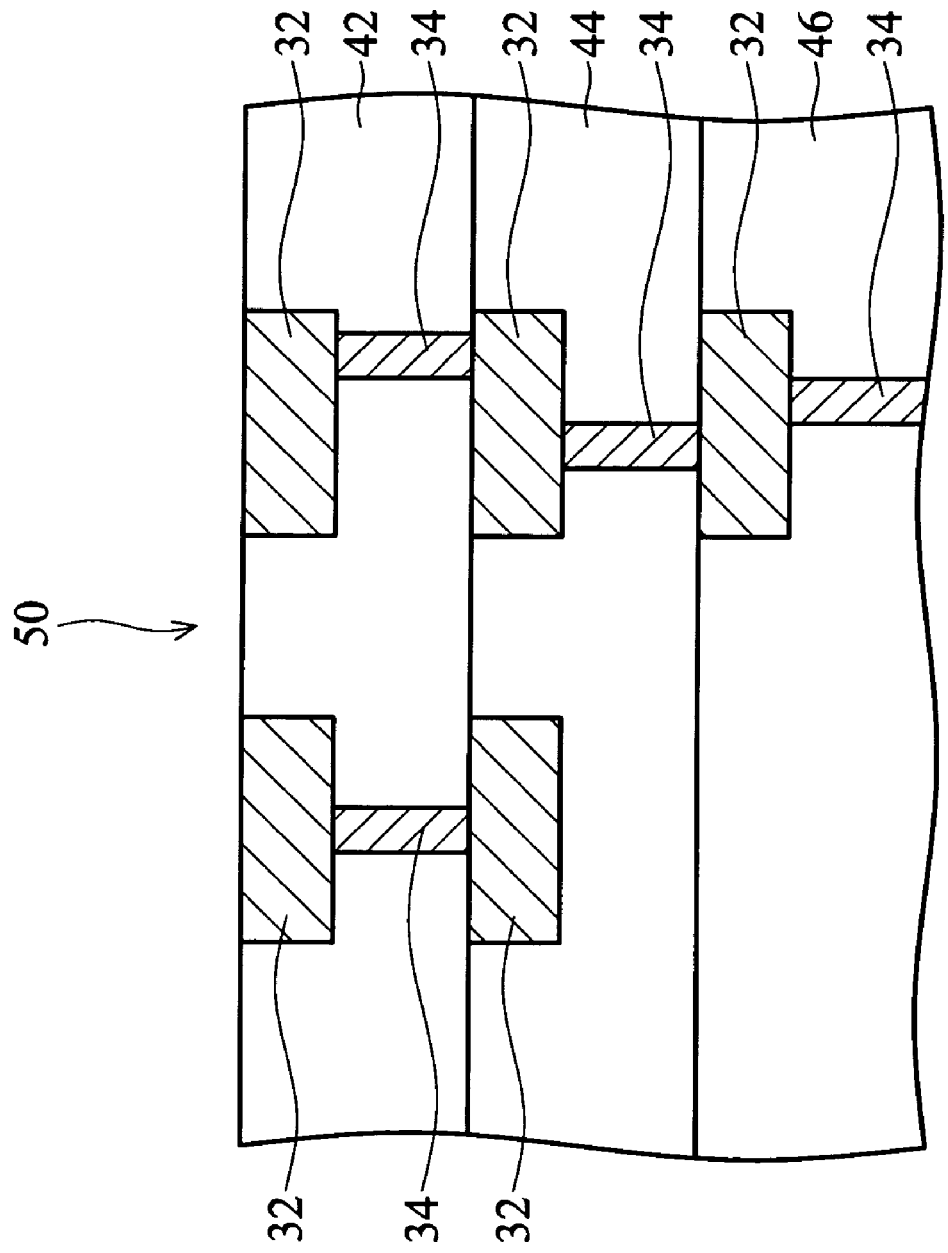
FIG. 2 is a cross section taken along line 2-2 of FIG. 1, showing structures of a scribe line area in the related art.
Figure 3:
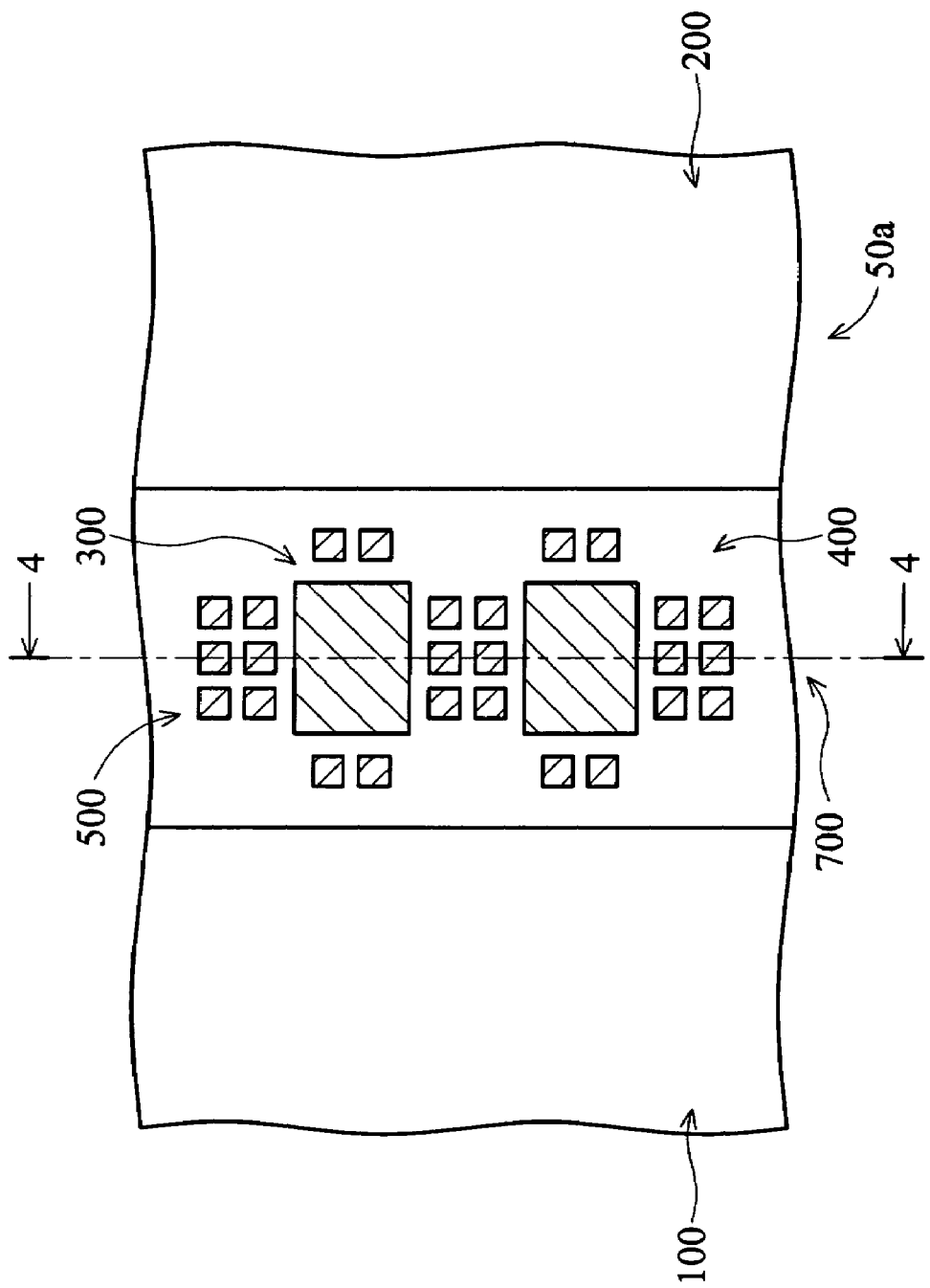
FIG. 3 is top view of a part of a wafer having a scribe line area separating two active areas of an embodiment of a reinforced semiconductor structure.

FIGS. 3-14 are schematic diagrams showing reinforced semiconductor structures of exemplary embodiments. FIG. 3 is a schematic top view showing a part of a wafer 50a comprising a scribe line area 400 separating two active areas 100 and 200 where the transistor circuitry and associated metal interconnects input pads, output pads, and MOS elements (both not shown) are formed. In the scribe line area 400, a plurality of test element groups (TEGs) 300 can be disposed substantially in a linear manner as shown in FIG. 3, but is not limited thereto. The TEGs 300 may include TEG modules each having a plurality of MOS elements and associated interconnect structures. In addition, the wafer 50a further comprises a plurality of non-dielectric pillars 500 disposed in the scribe line area 400, for providing additional resistance against stress induced during die sawing. Herein, the non-dielectric pillars 500 substantially surround a frontier of each of the TEGs 300 and a space between two adjacent TEGs 300. As shown in FIG. 3, the non-dielectric pillars 500 are formed in a square configuration arranged as an array, having a side about 2~10 μm and a spacing of about 0.5~15 μm therebetween. Herein, a topmost pad of each of the TEG modules is substantially rectangular and can be formed in a width of about 2~10 μm and a length of about 3~30 μm.

Figure 4:
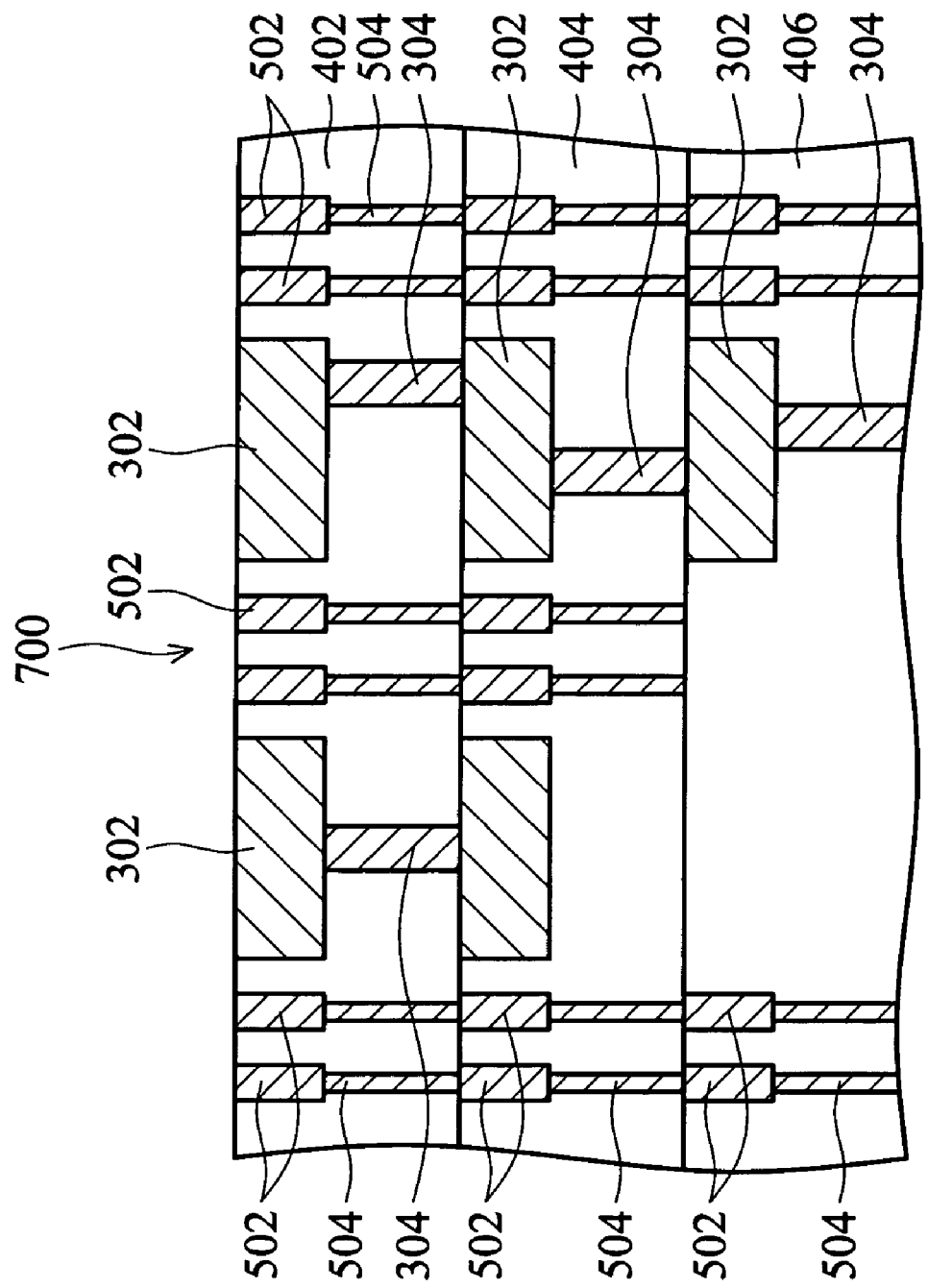
FIG. 4 is a cross section taken along line 4-4 of FIG. 3, showing structures of a scribe line area.

FIG. 4 illustrates a cross section taken along a dotted line 4-4 of FIG. 3, showing only associated interconnect structures formed in the TEGs 300, for simplicity. The dotted line 4-4 also shows the location of a scribe line 700. As shown in FIG. 4, top portions of the TEGs 300 including a plurality of dielectric layers 400, 402 and 404 formed over a semiconductor substrate (not shown) are illustrated, each having a plurality of conductive components 302 and 304 formed therein, wherein the conductive components 302 may function as conductive pads or conductive lines, and the components 304 may function as vias for connecting the conductive components 302 and/or MOS elements (not shown) may be formed thereunder. Moreover, the dielectric layers 402, 404 and 406 are formed with additional conductive components 502 and 504 therein. The conductive components 502 and 504 are respectively formed in the dielectric layers 402, 404 and 406 and sequentially stacked, forming the non-dielectric pillars 500 which are isolated from each other by the dielectric layers of the scribe line area 400. The conductive components 502 here may be formed with a greater size and the conductive components 504 are formed with a smaller size than that of the conductive components 502, functioning as conductive vias for connecting thereof, but is not limited thereto. The conductive components 502 here are formed in a square configuration (from top view), having a side of about 1~3 μm and a spacing of about 0.5~5 μm therebetween. The conductive components 504 are also formed in a square configuration (from top view), having a side not more than 3 μm and a spacing of about 1~6 μm therebetween.

As shown in FIG. 4, the dielectric layers 402, 404 and 406 may comprise conventional dielectrics such as silicon oxynitride or silicon oxide or low-k materials. Preferably, the dielectric layers 402, 404 and 406 comprises low-k materials and the low-k dielectric materials can be organic dielectrics such as benzocyclobutene (BCB), SiLK, available from Dow Chemical, and Flare, available from Allied Signal of Morristown or inorganic dielectrics of hydrogen silsesquioxane (HSQ), fluorocarbon silsesquioxane (FSQ), methylsilsesquioxane (MSQ), nanoglass, or similar. The conductive components 502 and 504 of the non-dielectric pillars 500 and the conductive segments 302 and 304 of the TEG 300 can comprise metal such as aluminum, copper, or alloys thereof, but is not limited thereto. Preferably, the non-dielectric pillars 500 can be formed of copper, aluminum, tungsten or the other conductive metal alloy and the dielectric layers 402, 404 and 406 comprise low-k dielectric materials for the purpose of easily fabrication. Therefore, the TEGs 300 and the non-dielectric pillars 500 can be simultaneously fabricated by, for example, a damascene process. Due to formation of the non-dielectric pillars 500 in the dielectric layers formed in the scribe line area 400, resistance of the scribe line area 400 against die sawing of the dielectric layers can be somewhat improved and migration of microcracking induced by the die sawing can be therefore reduced or even prevented.

Figure 5:
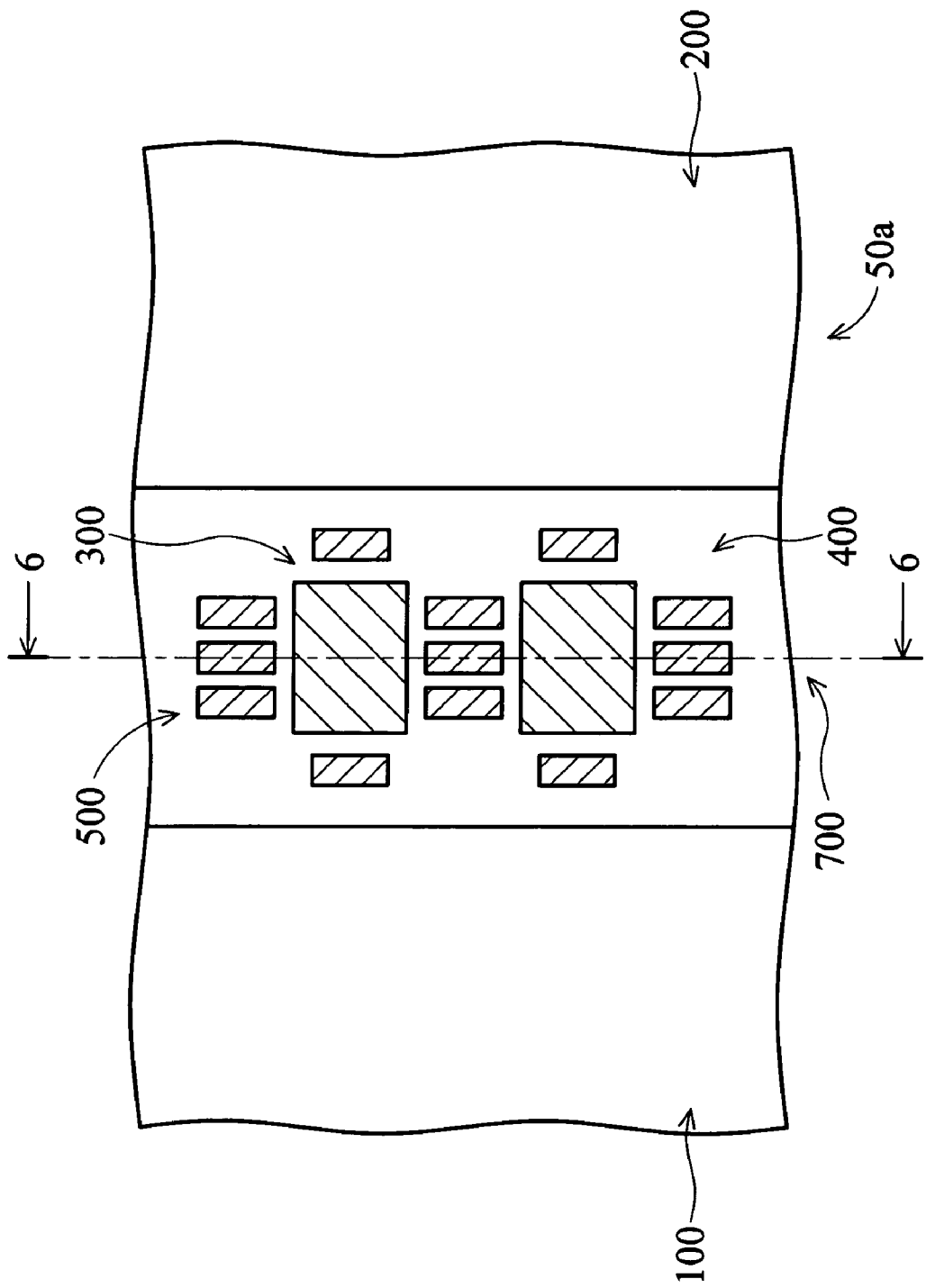
FIG. 5 is top view of a part of a wafer having a scribe line area separating two active areas of another embodiment of a reinforced semiconductor structure.
Figure 6:
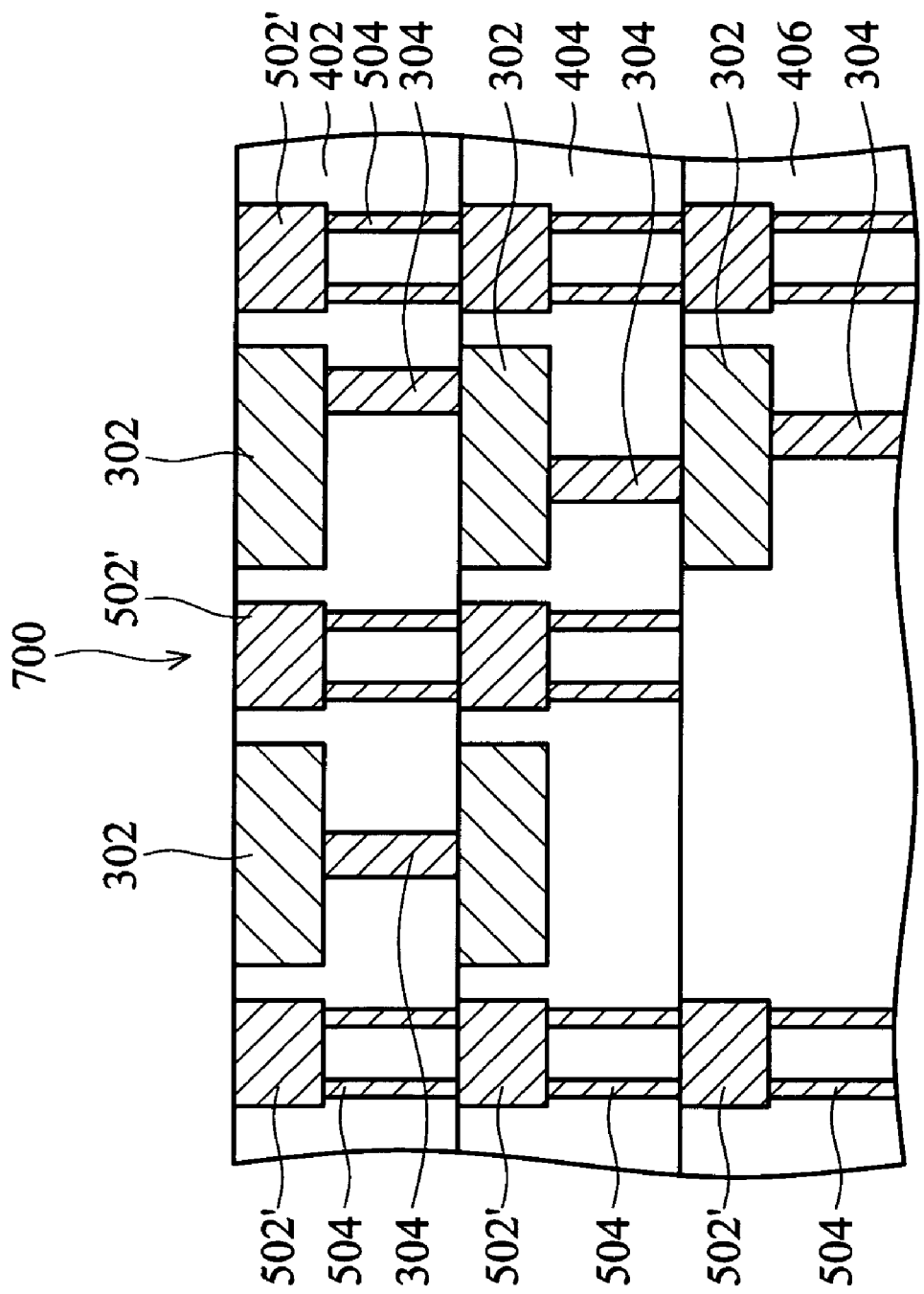
FIG. 6 is a cross section taken along line 6-6 of FIG. 5, showing structures of a scribe line area.

In addition, above non-dielectric pillars 500 and components thereof can be modified, having other configurations such as rectangular configurations, as a top view shown in FIG. 5. FIG. 6 illustrates a cross section taken along line 6-6 of FIG. 5 and a plurality of conductive components 502' are now respectively connected by two conductive components 504, but is not limited thereto. The underlying and overlying conductive components 502' can be connected by more than two conductive components 504. Since the conductive components 502' are formed in a rectangular configuration (from top view), the conductive components 502' may have a width and length of about 2~10 μm and 2~30 μm, respectively, and are formed with a spacing of about 0.5~15 μm therebetween. The conductive components 504 are also formed in a rectangular configuration (from top view), having a width and length not more than 3 μm and a spacing of about 1~3 μm therebetween.

Figure 7:
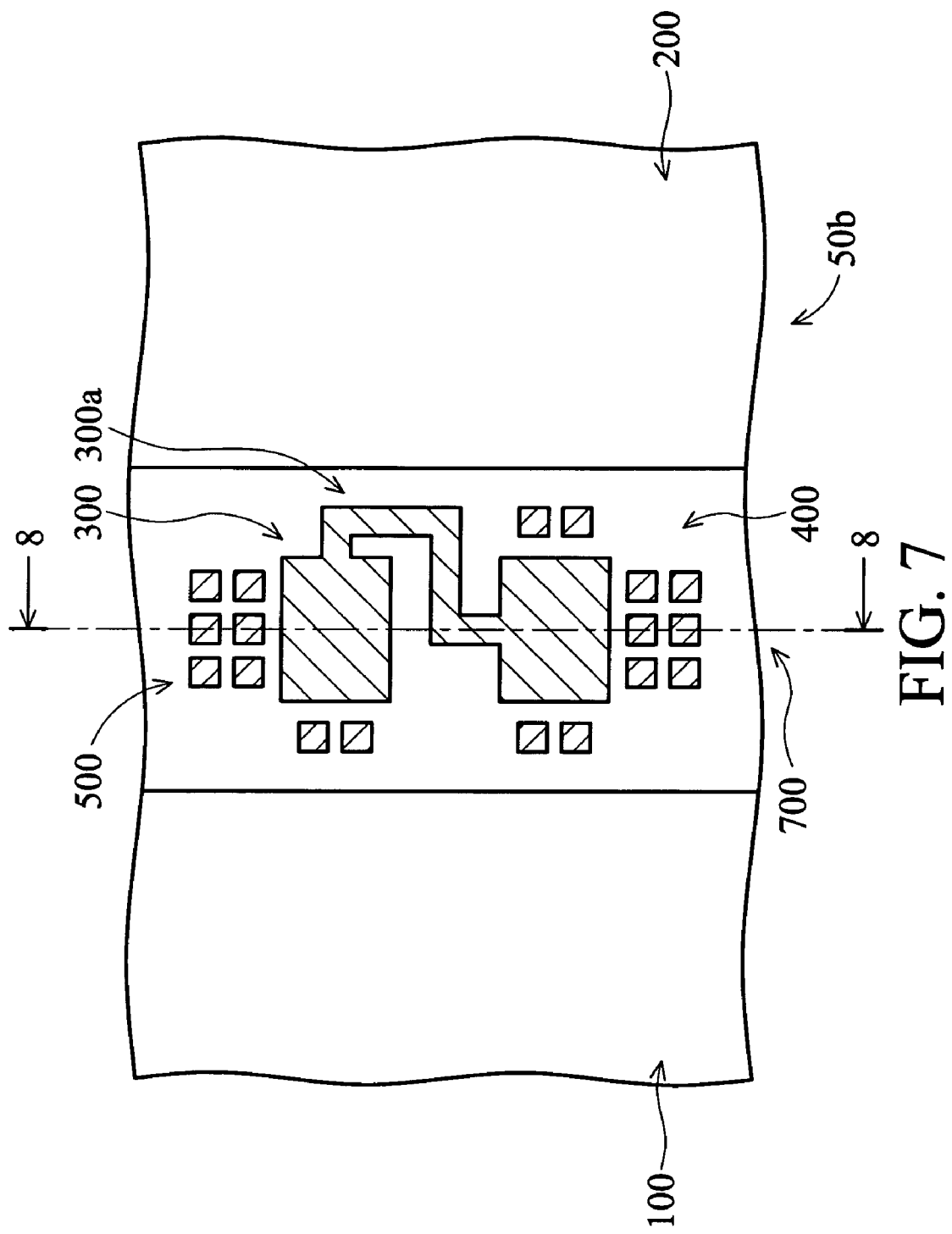
FIG. 7 is top view of a part of a wafer having a scribe line area separating two active areas of yet another embodiment of a reinforced semiconductor structure.
Figure 8:
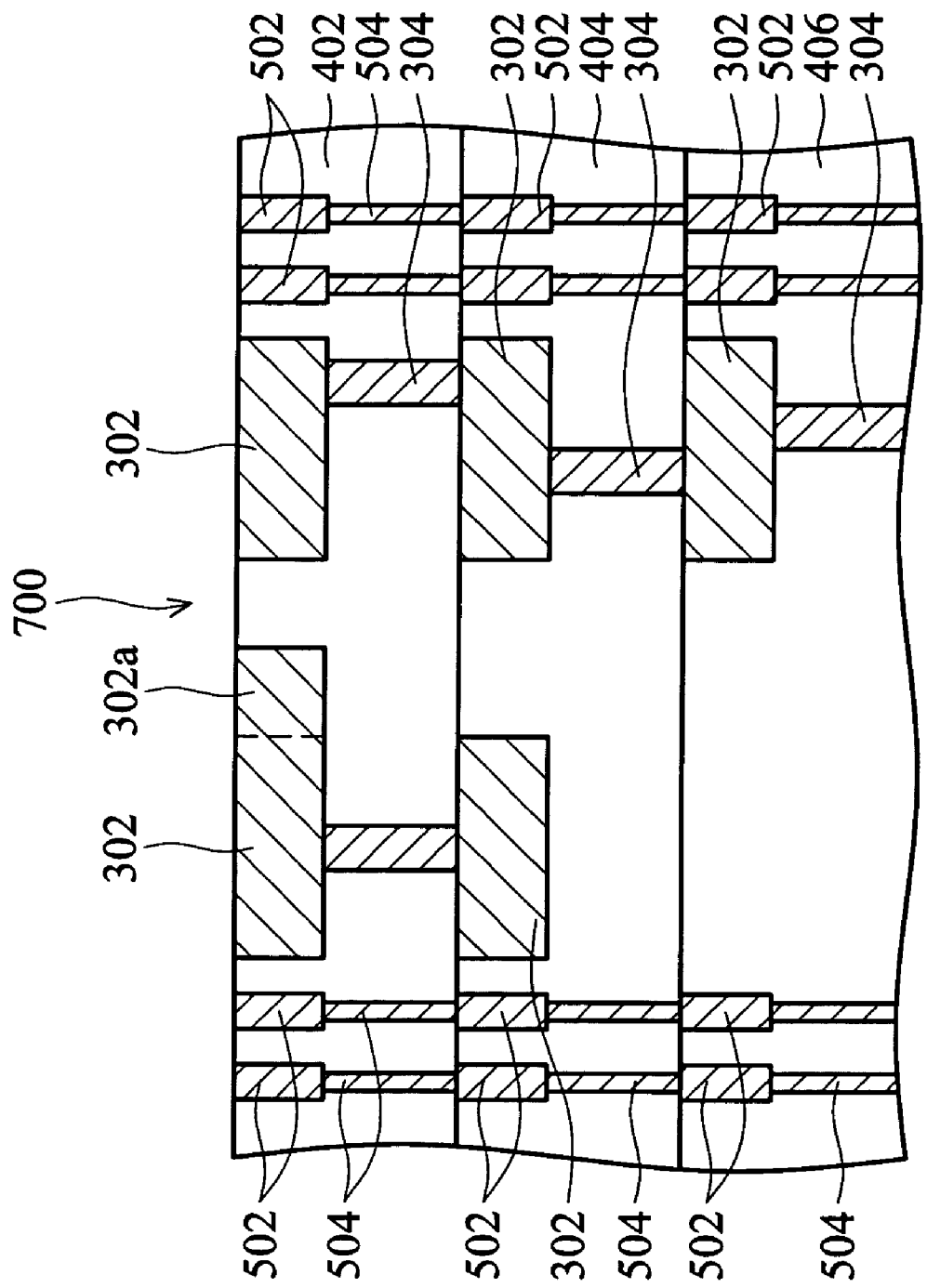
FIG. 8 is a cross section taken along line 8-8 of FIG. 7, showing structures of a scribe line area.

FIGS. 7 and 8 further illustrate schematic diagrams of another modified embodiment of a reinforced semiconductor structure similar to that illustrated in FIGS. 3-4. FIG. 7 shows top view of a part of a wafer 50b having a scribe line area 400 separating two active areas 100 and 200. In the scribe line area 400, a plurality of test element groups (TEGs) 300 are disposed substantially in a linear manner, but is not limited thereto. At this time, a connection 300a is formed in the scribe line area 400 and electrically connects a pair of the TEGs 300. In addition, the wafer 50b further comprises a plurality of non-dielectric pillars 500 disposed in the scribe line area 400, for providing additional resistance against stress induced during die sawing. Herein, the non-dielectric pillars 500 substantially surround a frontier of the TEGs 300 but are not formed therebetween. FIG. 8 shows a cross section taken along line 8-8 of FIG. 7 of a scribe line and shows the structures of a part of the scribe line area. Compared to the cross section illustrated in FIG. 4, an additional conductive component 302a is provided in the topmost dielectric layer 400, functioning as the connection 300a connecting a pair of TEGs illustrated in FIG. 5. Due to such pattern design, the conductive components 502 and 504 for forming the non-dielectric pillars are not formed in the portion of the dielectric layers 400, 402 and 404, as illustrated in FIG. 8.

Figure 9:
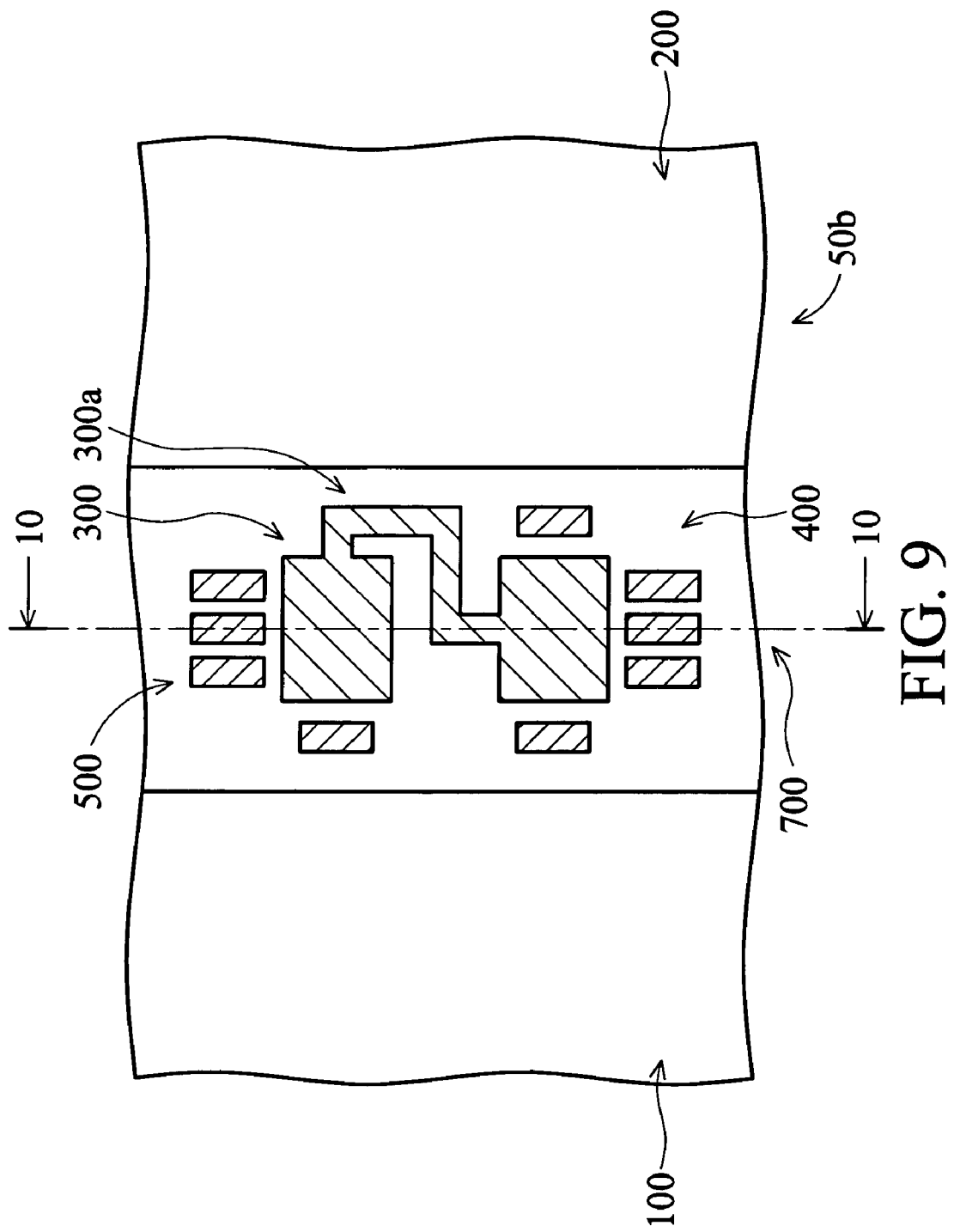
FIG. 9 is top view of a part of a wafer having a scribe line area separating two active areas of yet another embodiment of a reinforced semiconductor structure.
Figure 10:
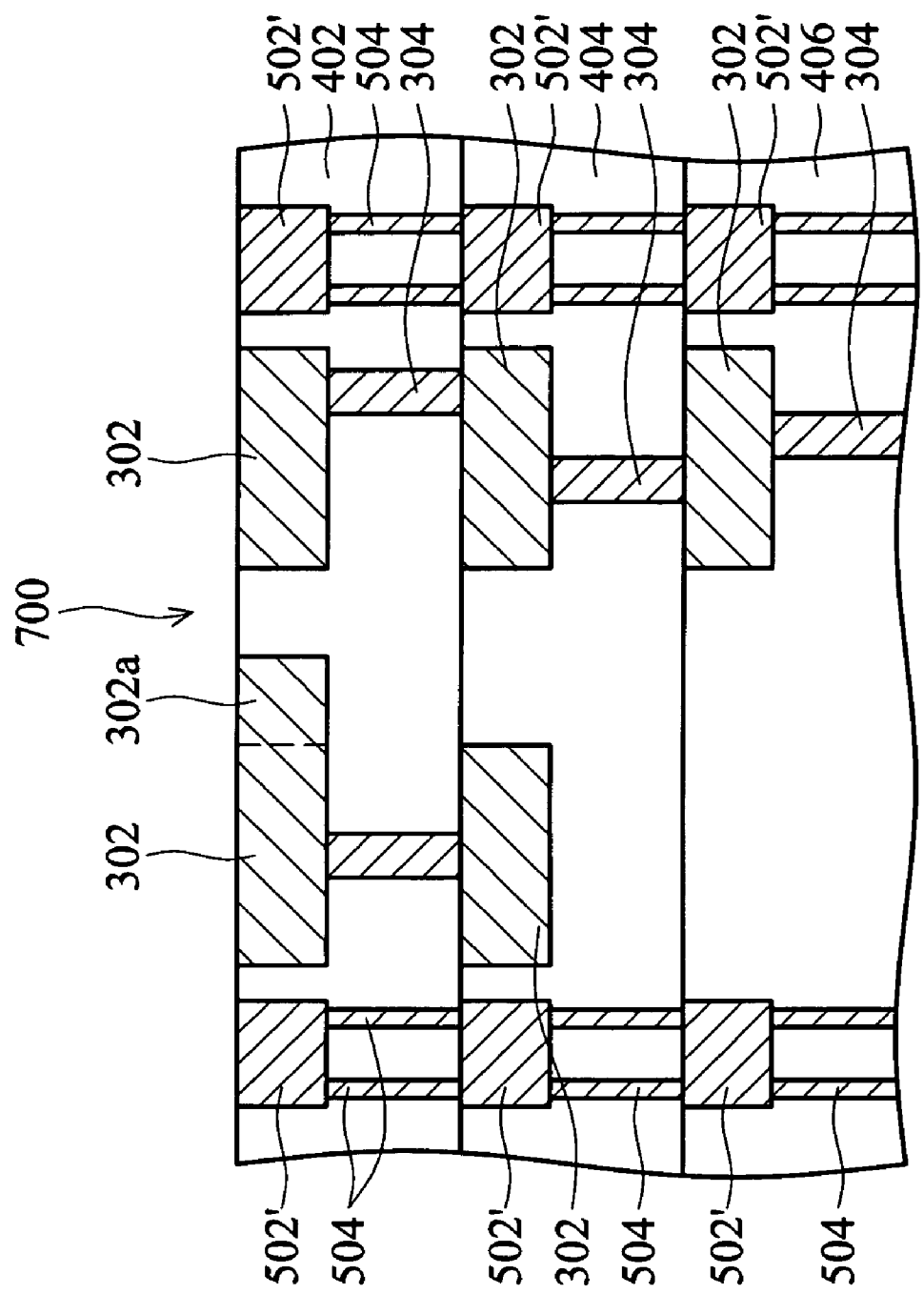
FIG. 10 is a cross section taken along line 10-10 of FIG. 9, showing structures of a scribe line area.

FIGS. 9 and 10 illustrate schematic diagrams of a modified embodiment of a reinforced semiconductor structure similar to that illustrated in FIGS. 7-8. FIG. 9 shows top view of a part of a wafer 50b having a scribe line area 400 separating two active areas 100 and 200. In the scribe line area 400, a plurality of test element groups (TEGs) 300 are disposed substantially in a linear manner, but is not limited thereto. At this time, a connection 300a is formed in the scribe line area 400 and electrically connects a pair of the TEGs 300. In addition, the wafer 50b further comprises a plurality of non-dielectric pillars 500 disposed in the scribe line area 400, for providing additional resistance against stress induced during die sawing. Herein, the non-dielectric pillars 500 have a configuration similar to that illustrated in FIG. 5. and are substantially surround a frontier of the TEGs 300 but are not formed therebetween. FIG. 10 shows a cross section taken along line 10-10 of FIG. 9 of a scribe line and shows the structures of a part of the scribe line area. As shown in FIG. 10, the non-dielectric pillars 500 have same components as those illustrated in FIG. 6 and the TEGs 300 have same components as those illustrated in FIG. 8 and are not described here again, for simplicity.

Figure 11:
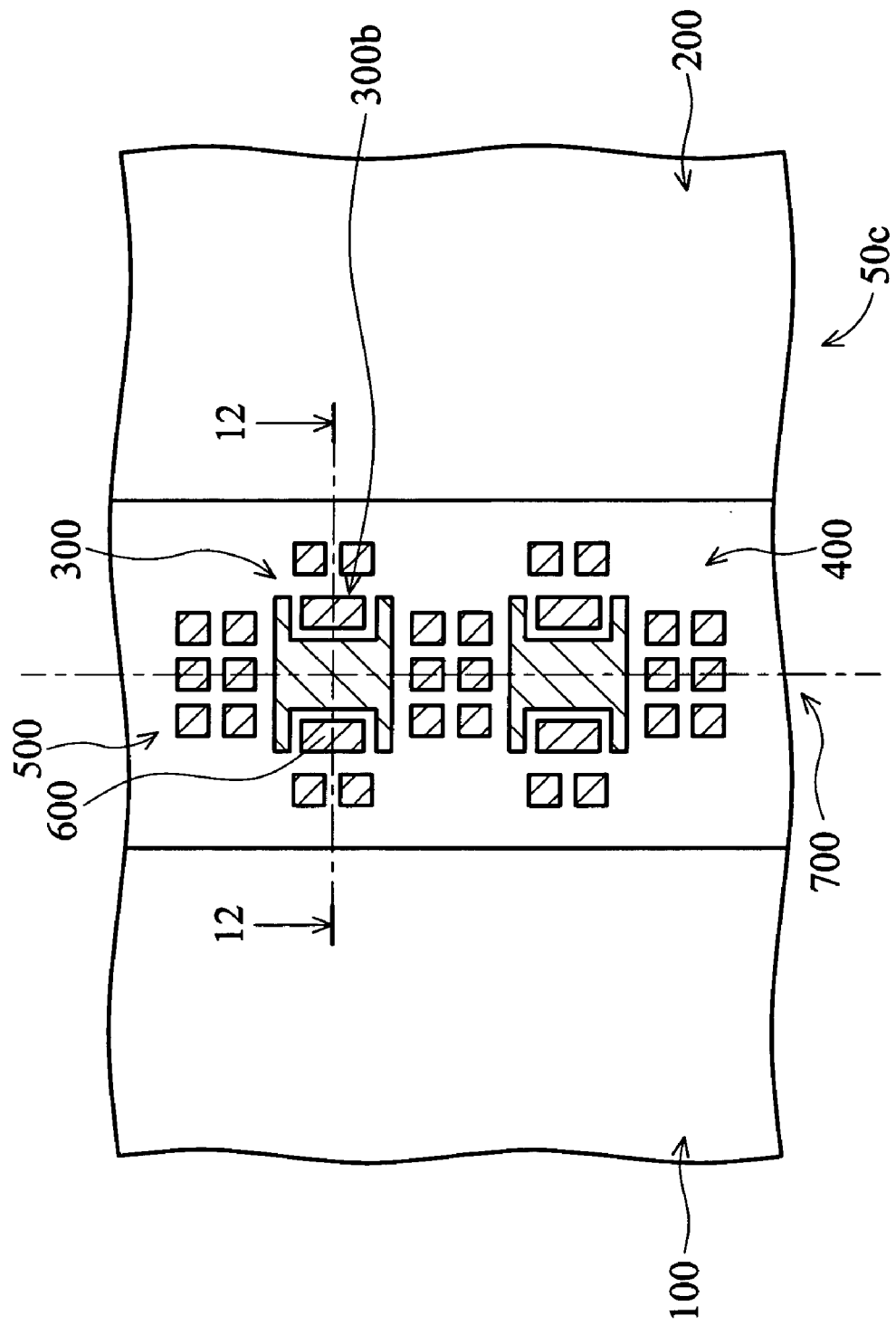
FIG. 11 is top view of a part of a wafer having a scribe line area separating two active areas of yet another embodiment of a reinforced semiconductor structure.
Figure 12:
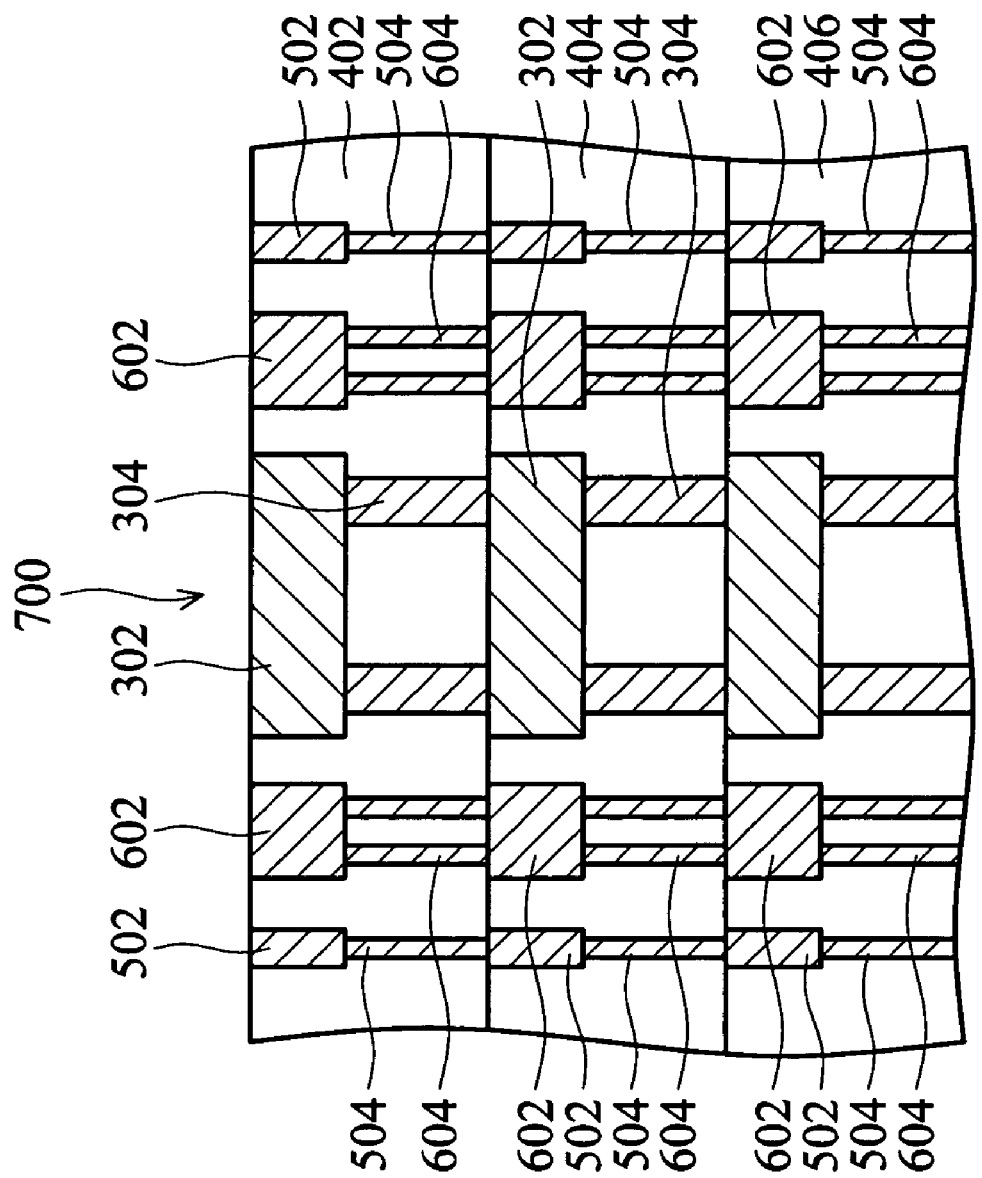
FIG. 12 is a cross section taken along line 12-12 of FIG. 11, showing structures of a scribe line area.

FIGS. 11 and 12 are schematic diagrams showing another modified embodiment of a reinforced semiconductor structure similar to that illustrated in FIGS. 3-4 and 5-6. FIG. 11 shows top view of a part of a wafer 50c having a scribe line area 400 separating two active areas 100 and 200. In the scribe line area 400, a plurality of test element groups (TEGs) 300 are disposed substantially in a linear manner, but is not limited thereto. At this time, the test element group (TEG) 300 is formed with a recess 300b at opposing sides thereof and a non-dielectric pillar 600 is provided therein. In addition, the wafer 50b further comprises a plurality of non-dielectric pillars 500 disposed in the scribe line area 400, for providing additional resistance against stress induced during die sawing. Herein, the non-dielectric pillars 500 substantially surround a frontier of the TEGs 300. The non-dielectric pillars 500 as shown in FIG. 11 have similar configurations illustrated in FIGS. 3 and 7 and the non-dielectric pillar 600s have similar configurations illustrated in FIGS. 5 and 9. FIG. 12 shows a cross section taken along line 12-12 of FIG. 11, illustrating structures of a part of the scribe line area 400. Compared to the cross section illustrated in FIG. 4, additional conductive components 602 and 604 are provided in the dielectric layers 402, 404 and 406, functioning as the non-dielectric pillars 600 respectively formed at a recess 300b of the TEGs 300 as illustrated in FIG. 12. The conductive components 602 and 604 can comprise materials the same as that of the components 502, 504, 302 and 304, and can be therefore simultaneously fabricated therewith.

Figure 13:
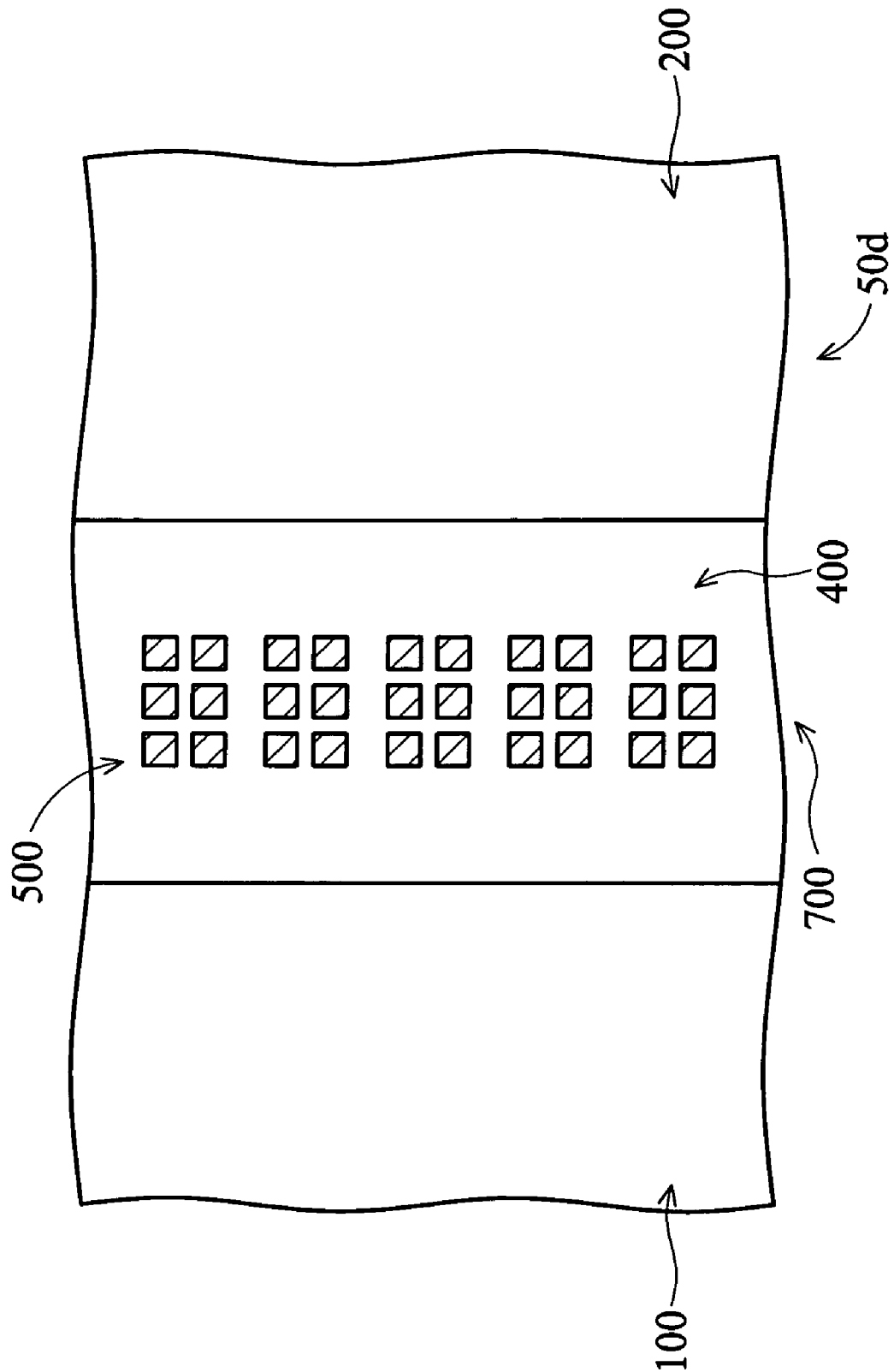
FIGS. 13 and 14 are top views of a part of a wafer having a scribe line area separating two active areas of yet another embodiments of a reinforced semiconductor structure.
Figure 14:
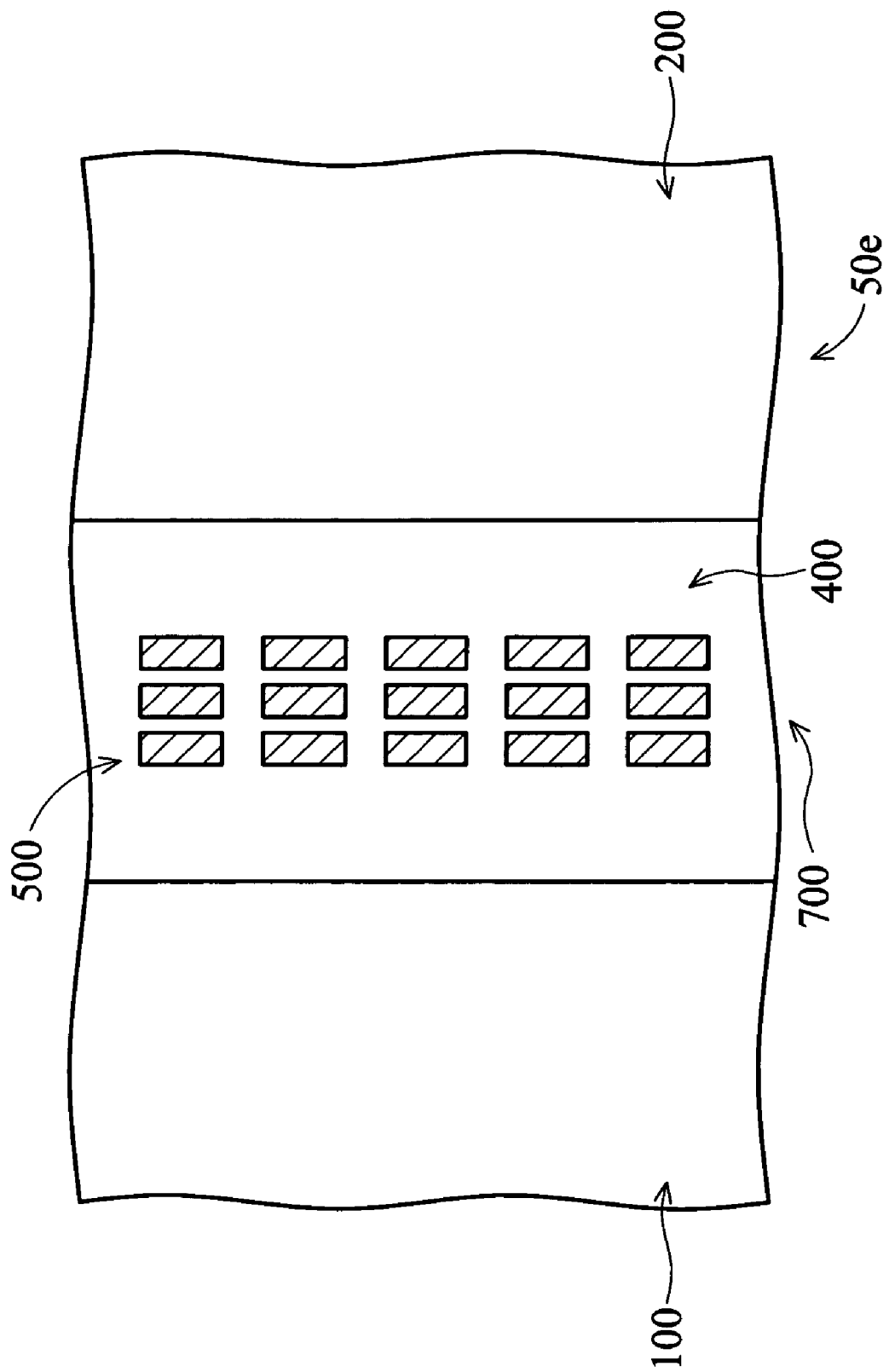

The above non-dielectric pillars illustrated in FIGS. 4-12 can be formed in other places of the scribe line area where no TEGs formed therein for providing additional resistance against stress induced during die sawing. FIGS. 13 and 14 illustrate embodiments of a reinforced semiconductor structure having non-dielectric pillars formed in a scribe line area 400 at a place without TEG therein. FIG. 13 illustrates a top view of a part of a wafer 50d having a scribe line area 400 separating two active areas 100 and 200. In the scribe line area 400, a plurality of non-dielectric pillars 500 are disposed in the scribe line area 400 at a place where no test element groups (TEGs) 300 are disposed and are arranged as an array. At this time, the non-dielectric pillars 500 have the same view as those illustrated in FIGS. 3 and 7 and cross sections thereof are the same as those illustrated in FIGS. 4 and 8. FIG. 14 illustrates a top view of a part of a wafer 50e having a scribe line area 400 separating two active areas 100 and 200. In the scribe line area 400, a plurality of non-dielectric pillars 500 are disposed in the scribe line area 400 at a place where no test element groups (TEGs) 300 are disposed and are arranged as an array. At this time, the non-dielectric pillars 500 have the same view as those illustrated in FIGS. 5 and 9 and cross sections thereof are the same as those illustrated in FIGS. 6 and 10.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reinforced semiconductor structure, comprising:
   a semiconductor wafer comprising a plurality of low-k dielectric layers formed thereon;
   at least one scribe line region defined over the semiconductor wafer, separating at least two active regions formed over the semiconductor wafer;
   at least one test element formed in the scribe line region, passing through the low-k dielectric layers therein and having a test pad exposed by a topmost low-k layer of the low-k dielectric layers therein;
   a plurality of first non-dielectric pillars formed in the topmost layer of the low-k dielectric layers in the scribe line region; and
   a plurality of second non-dielectric pillars and first vias formed in a first low-k dielectric layer underlying the topmost low-k layer in the scribe line region, wherein the second non-dielectric pillars electrically connect the first non-dielectric pillars by the first vias, respectively, wherein the first vias and the first and second non-dielectric pillars surround the test pad from each side thereof.

2. The reinforced semiconductor structure as claimed in claim 1, further comprising a plurality of third non-dielectric pillars and second vias formed in a second low-k dielectric layer underlying the first low-k dielectric layer in the scribe line region, wherein the third non-dielectric pillars electrically connect the second non-dielectric pillars by the second vias, respectively.

3. The reinforced semiconductor structure as claimed in claim 1, wherein the test element further comprises a plurality of conductive segments and vias formed in the low-k dielectric layers underlying the topmost low-k dielectric layer in the scribe line region, electrically connecting the test pad and forming a conductive pathway to an underlying active device.

4. The reinforced semiconductor structure as claimed in claim 1, wherein the test element and the first non-dielectric pillars comprise same conductive materials.

5. The reinforced semiconductor structure as claimed in claim 1, wherein the first non-dielectric pillars, the test element and the second non-dielectric pillars comprise the same conductive materials.

6. The reinforced semiconductor structure as claimed in claim 2, wherein the first non-dielectric pillars, the test element, the second non-dielectric pillars and the third non-dielectric pillars comprise the same conductive materials.

7. A reinforced semiconductor structure, comprising:
a semiconductor wafer comprising a plurality of low-k dielectric layers formed thereon;
at least one scribe line region defined over the semiconductor wafer, separating at least two active regions formed over the semiconductor wafer;
a plurality of test elements formed in the scribe line region, each passing through the low-k dielectric layers therein and having a test pad exposed by the topmost low-k layer of the low-k dielectric layers therein;
a plurality of first non-dielectric pillars formed in the topmost layer of the low-k dielectric layers in the scribe line region;
a plurality of second non-dielectric pillars and first vias formed in a first low-k dielectric layer underlying the topmost low-k layer in the scribe line region, wherein the second non-dielectric pillars electrically connect the first non-dielectric pillars by the first vias, respectively; and
a conductive segment is formed in the topmost layer of the dielectric layers, to physically connect a pair of test pads of the test elements, wherein the first vias and the first and second non-dielectric pillars surround the test pads connected with the conductive segment from at least two sides thereof.

8. The reinforced semiconductor structure as claimed in claim 7, further comprising a plurality of third non-dielectric pillars and second vias formed in a second low-k dielectric layer underlying the first low-k dielectric layer in the scribe line region, wherein the third non-dielectric pillars electrically connect the second non-dielectric pillars by the second vias, respectively.

9. The reinforced semiconductor structure as claimed in claim 7, the test element further comprising a plurality of conductive segments and vias formed in the low-k dielectric layers underlying the first low-k dielectric layer in the scribe line region, respectively, electrically connecting the test pad and thereby forming a conductive pathway to an underlying active device.

10. The reinforced semiconductor structure as claimed in claim 7, wherein the test elements, the first non-dielectric pillars and the conductive segment comprise the same conductive materials.

11. The reinforced semiconductor structure as claimed in claim 7, wherein the first non-dielectric pillars, the test elements, the second non-dielectric pillars and the conductive segment comprise the same conductive materials.

12. The reinforced semiconductor structure as claimed in claim 8, wherein the first non-dielectric pillars, the test elements, the second non-dielectric pillars, the third non-dielectric pillars and the conductive segment comprise the same conductive materials.

13. A reinforced semiconductor structure, comprising:
a semiconductor wafer comprising a plurality of low-k dielectric layers formed thereon;
at least one scribe line region defined over the semiconductor wafer, separating at least two active regions formed over the semiconductor wafer;
at least one test element formed in the scribe line region, passing through the low-k dielectric layers therein and having a test pad exposed by a topmost low-k layer of the low-k dielectric layers therein, wherein the test pad comprises a recess on opposing sides thereof;
a plurality of first non-dielectric pillars formed in the topmost layer of the low-k dielectric layers in the scribe line region, surrounding the test pad from each side thereof; and
a second non-dielectric pillar formed at the recess and in the topmost low-k layer of the low-k dielectric layers and is surrounded by the first non-dielectric pillars, electrically isolated from the test pad and the first non-dielectric pillars.

14. The reinforced semiconductor structure as claimed in claim 13, further comprising a plurality of third non-dielectric pillars and first vias formed in a first dielectric layer underlying the topmost low-k layer in the scribe line region, wherein the third non-dielectric pillars electrically connect the first and second non-dielectric pillars by the first vias, respectively.

15. The reinforced semiconductor structure as claimed in claim 14, further comprising a plurality of fourth non-dielectric pillars and second vias formed in a second dielectric layer underlying the first dielectric layer in the scribe line region, wherein the fourth non-dielectric pillars electrically connect the third non-dielectric pillars by the second vias, respectively.

16. The reinforced semiconductor structure as claimed in claim 13, wherein the test element further comprises a plurality of conductive segments and vias formed in the low-k dielectric layers underlying the topmost low-k dielectric layer in the scribe line region, electrically connecting the test pad and forming a conductive pathway to an underlying active device.

17. The reinforced semiconductor structure as claimed in claim 13, wherein the test element and the first and second non-dielectric pillars comprise the same conductive materials.

18. The reinforced semiconductor structure as claimed in claim 14, wherein the first and second non-dielectric pillars, the test element, the third non-dielectric pillars and the fourth non-dielectric pillars comprise the same conductive materials.

19. The reinforced semiconductor structure as claimed in claim 1, further comprising a plurality of third non-dielectric pillars and second vias formed in a second low-k dielectric layer underlying the first low-k dielectric layer in the scribe line region, wherein the third non-dielectric pillars electrically connect the second non-dielectric pillars by the second vias, respectively,
wherein the test element further comprises a plurality of conductive segments and vias formed in the low-k dielectric layers underlying the topmost low-k dielectric layer in the scribe line region, electrically connecting the test pad and forming a conductive pathway to an underlying active device, and
wherein the first non-dielectric pillars, the test element, the second non-dielectric pillars and the third non-dielectric pillars comprise the same conductive materials.

20. The reinforced semiconductor structure as claimed in claim 13, further comprising a plurality of third non-dielectric pillars and first vias formed in a first dielectric layer underlying the topmost low-k layer in the scribe line region, wherein the third non-dielectric pillars electrically connect the first and second non-dielectric pillars by the first vias, respectively, wherein the test element further comprising a plurality of conductive segments and vias formed in the low-k dielectric layers underlying the topmost low-k dielectric layer in the scribe line region, electrically connecting the test pad and forming a conductive pathway to an underlying active device, and wherein the first non-dielectric pillars, the test element, the second non-dielectric pillars and the third non-dielectric pillars comprise the same conductive materials.

* * * * *